(12) United States Patent
White et al.

(10) Patent No.: US 10,233,528 B2
(45) Date of Patent: Mar. 19, 2019

(54) MASK FOR DEPOSITION SYSTEM AND METHOD FOR USING THE MASK

(71) Applicant: Applied Materials, Inc., Santa Clara, CA (US)

(72) Inventors: John Macneill White, Hayward, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 607 days.

(21) Appl. No.: 14/733,913

(22) Filed: Jun. 8, 2015

(65) Prior Publication Data
US 2016/0355924 A1    Dec. 8, 2016

(51) Int. Cl.
| | | |
|---|---|---|
| C23C 14/04 | (2006.01) | |
| C23C 14/54 | (2006.01) | |
| C23C 14/56 | (2006.01) | |
| H01L 51/00 | (2006.01) | |

(52) U.S. Cl.
CPC .......... *C23C 14/042* (2013.01); *C23C 14/545* (2013.01); *C23C 14/564* (2013.01); *C23C 14/568* (2013.01); *H01L 51/0011* (2013.01)

(58) Field of Classification Search
None
See application file for complete search history.

(56) References Cited

U.S. PATENT DOCUMENTS

| | | | |
|---|---|---|---|
| 6,858,454 | B1 | 2/2005 | Kanzawa et al. |
| 7,214,554 | B2 | 5/2007 | Winters et al. |
| 8,961,690 | B2 | 2/2015 | Hoffmann et al. |
| 2001/0007244 | A1 | 7/2001 | Matsuse |
| 2002/0142493 | A1 | 10/2002 | Halliyal et al. |
| 2003/0228715 | A1 | 12/2003 | Brody et al. |
| 2005/0208698 | A1 | 9/2005 | Winters et al. |
| 2005/0244570 | A1 | 11/2005 | Tanase et al. |
| 2010/0080915 | A1* | 4/2010 | Masuda ................ C23C 14/042 427/282 |

FOREIGN PATENT DOCUMENTS

| | | |
|---|---|---|
| KR | 20100083362 A | 7/2010 |
| WO | 2010027178 A2 | 3/2010 |

OTHER PUBLICATIONS

International Search Report and Written Opinion for Application No. PCT/US2016/029861 dated Jul. 29, 2016.

* cited by examiner

*Primary Examiner* — Karla A Moore
*Assistant Examiner* — Tiffany Z Nuckols
(74) *Attorney, Agent, or Firm* — Patterson + Sheridan LLP

(57) ABSTRACT

Embodiments of the disclosure provide methods and apparatus for monitoring film properties on a substrate in-situ. In one embodiment, a deposition system is provided. The deposition system includes at least two deposition chambers, and a patterned mask designed specifically for each of the deposition chambers, wherein a first mask of the patterned masks has a first opening formed therethrough outside of a pattern formed thereon, and a second mask of the patterned masks has a first opening formed therethrough outside of a pattern formed thereon, the first opening of the second mask having a position on the second mask that is different than a position of the first opening on the first mask.

19 Claims, 7 Drawing Sheets

MASK FOR DEPOSITION SYSTEM AND METHOD FOR USING THE MASK

BACKGROUND

Field of the Disclosure

Embodiments of the disclosure relate to depositing materials on substrates utilizing patterned shadow masks and a method of using the same. In particular, embodiments disclosed herein relate to a process of coating at least one substrate using a plurality of deposition sources and a method and apparatus for monitoring film properties during the coating process.

Description of Related Art

In the manufacture of flat panel displays for television screens, cell phone displays, computer monitors, and the like, organic light-emitting diodes (OLED's) have attracted attention. OLED's are a special type of light-emitting diodes in which a light-emissive layer comprises a plurality of thin films of certain organic compounds. OLED's can also be used for general space illumination. The range of colors, brightness, and viewing angle possible with OLED displays are greater than those of traditional displays because OLED pixels emit light directly and do not require a back light. Therefore, the energy consumption of OLED displays is considerably less than that of traditional displays. Further, the fact that OLED's can be manufactured onto flexible substrates opens the door to new applications such as roll-up displays or even displays embedded in flexible media.

Current OLED manufacturing requires evaporation of organic materials. The functionality of an OLED depends on the properties of the organic material that is deposited as thin films on a substrate. Multiple masking and deposition steps are typically performed under reduced pressures to form a stack of the thin-films on the substrate. Properties such as thickness and quality of the film affect the final product. However, conventionally, it is difficult to monitor properties of the films during production of the display(s). Thus, a defect in one or more of the thin films may not be discovered until after the display(s) have been removed from the reduced pressure environment. Thus, after discovery of the defect, a substrate may be scrapped after multiple processes have been performed. Further, due to the nature of evaporation, uniformity of the deposited film may be difficult to achieve.

Therefore, there is a need to monitor the uniformity in the manufacture of OLED devices in which the films are typically deposited sequentially in an inline system.

SUMMARY

Embodiments of the disclosure provide methods and apparatus for monitoring film properties on a substrate during fabrication of electronic devices on the substrate.

In one embodiment, a deposition system is provided. The deposition system includes at least two deposition chambers, and a patterned mask designed specifically for each of the deposition chambers, wherein a first mask of the patterned masks has a first opening formed therethrough outside of a pattern formed thereon, and a second mask of the patterned masks has a first opening formed therethrough outside of a pattern formed thereon, the first opening of the second mask having a position on the second mask that is different than a position of the first opening on the first mask.

In another embodiment, a deposition system is provided. The deposition system includes a plurality of deposition chambers, and a patterned mask dedicated to each of the deposition chambers, wherein a first mask of the patterned masks has a first opening formed therethrough outside of a pattern formed thereon, a second mask of the patterned masks has a first opening formed therethrough outside of a pattern formed thereon, the first opening of the second mask having a position on the second mask that is different than a position of the first opening on the first mask, and third mask of the patterned masks has a first opening formed therethrough outside of a pattern formed thereon, the first opening of the third mask having a position on the third mask that is different than the positions of the first openings of the first and second masks.

In another embodiment, a method for forming a plurality of film layers on a substrate is provided. The method includes inserting the substrate into a deposition system comprising a plurality of chambers, each chamber having a patterned mask disposed therein. The method also includes depositing a first film layer on the substrate in a first chamber using a first patterned mask, wherein a portion of the film layer is deposited outside of a pattern of the patterned mask. The method also includes transferring the substrate to a second chamber, and monitoring the portion of the film layer that is deposited outside of the pattern of the patterned mask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
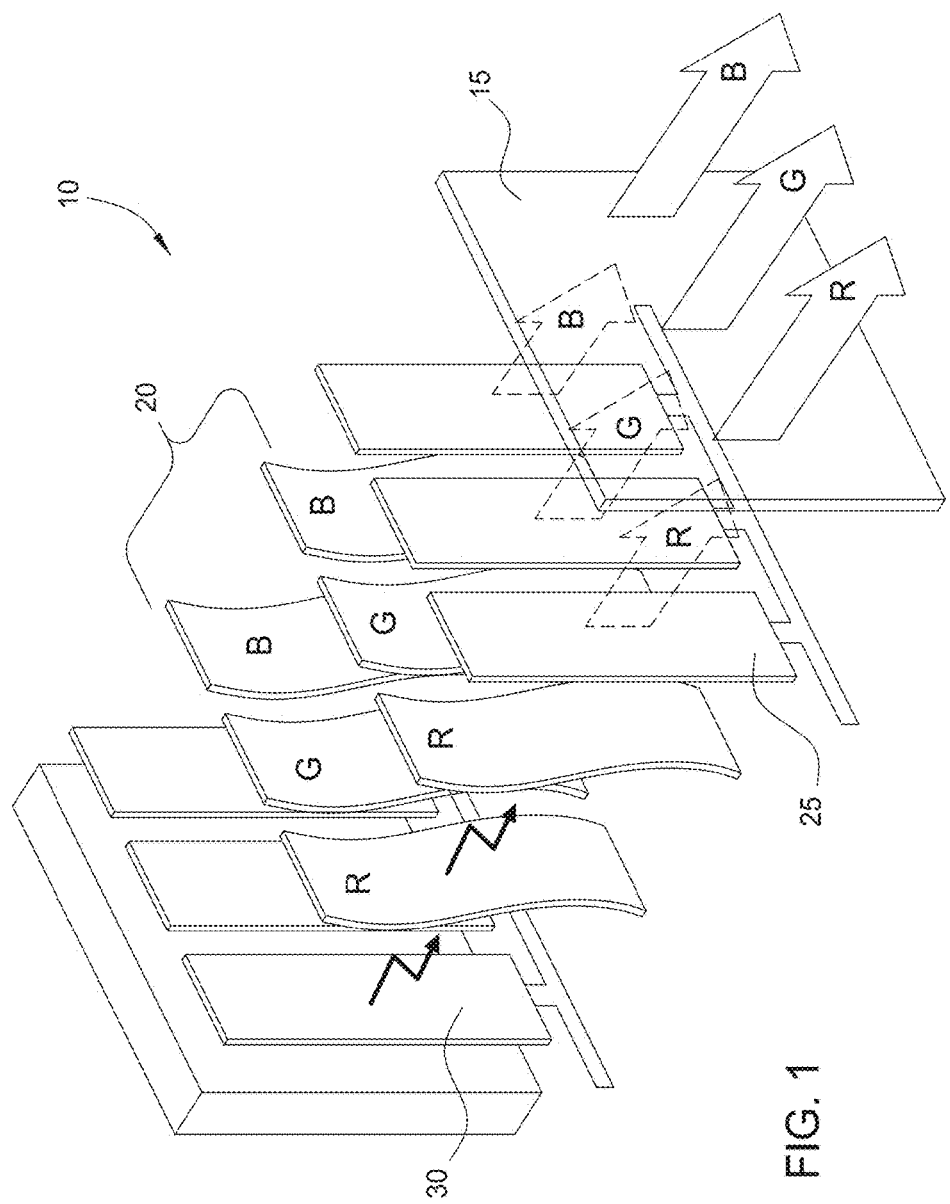
FIG. 1 is an isometric exploded view of an OLED device that may be manufactured utilizing embodiments described herein.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the disclosure provide methods and apparatus for monitoring film properties on a substrate in-situ. For example, monitoring film properties during a deposition or coating process wherein multiple layers of thin films are deposited on the substrate. As an example, the thin films may form a portion of a display or displays on the substrate comprising OLED's. The thin films may be derived from organic materials utilized in the fabrication of OLED displays. The substrate may be made of glass, plastic, or other material suitable for electronic device formation. Embodiments disclosed herein may be practiced in chambers and/or systems available from AKT, Inc., a division of Applied Materials, Inc., of Santa Clara, Calif. Embodiments disclosed herein may also be practiced in chambers and/or systems from other manufacturers.

FIG. 1 is an isometric exploded view of an OLED device 10. The OLED device 10 may be formed on a substrate 15. The substrate 15 may be made of glass, transparent plastic, or other transparent material suitable for electronic device formation. The OLED device 10 includes one or more organic material layers 20 sandwiched between two electrodes 25 and 30. The electrode 25 is typically a transparent material such as indium tin oxide (ITO) and may function as an anode. The electrode 30 may be a metallic material and function as a cathode. Upon power application to the electrodes 25 and 30, light is generated in the organic material layers 20. The light may be one or a combination of red R, green G and blue B generated from corresponding RGB films of the organic material layers 20. Although not shown, the OLED device 10 may also include one or more hole injection layers as well as one or more electron transporting layers disposed between the electrodes 25 and 30 and the organic material layers 20. Additionally, while not shown, the OLED device 10 may include a film layer for white light generation. The film layer for white light generation may be a film in the organic material layers 20 and/or a filter sandwiched within the OLED device 10.

Figure 2:
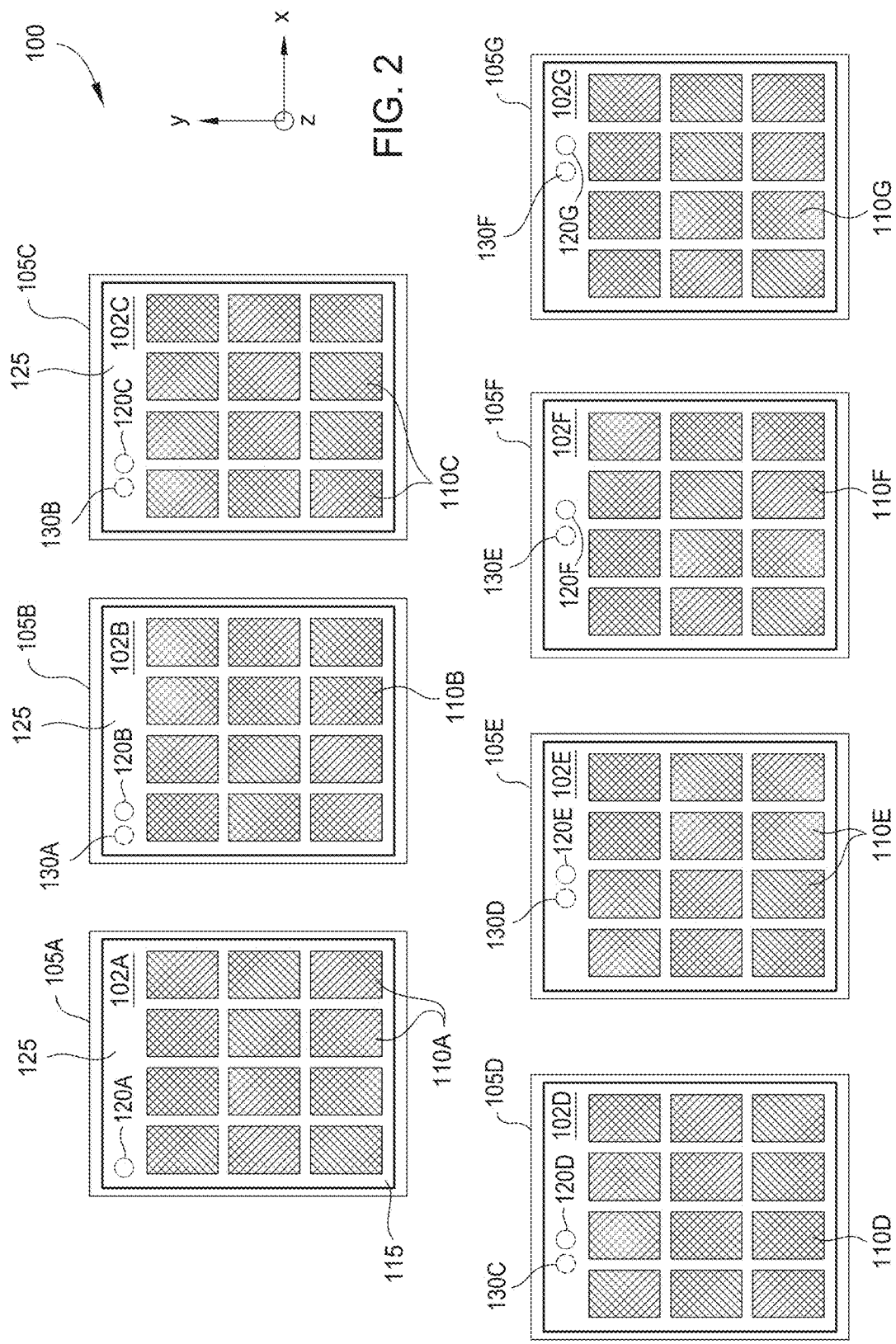
FIG. 2 is a schematic plan view of a deposition system according to one embodiment.

FIG. 2 is a schematic sectional view of a plurality of chambers 105A-105G that may be part of a deposition system 100 according to one embodiment. A plurality of patterned masks 102A-102G are schematically shown disposed within a respective chamber 105A-105G of the deposition system 100. In each chamber 105A-105G, a layer or layers may be deposited on a substrate (not shown) utilizing a respective patterned mask 102A-102G. The cross-sectional view of the chambers 105A-105G shown in FIG. 2 may be in plan view such that the substrate is above or below the patterned masks 102A-102G. In this view, a deposition source (not shown) is provided for each of the chambers 105A-105G on the side of the patterned masks 102A-102G opposite the substrate. Alternatively, the cross-sectional view of the chambers 105A-105G shown in FIG. 2 may be a side view such that the substrate is in front of or behind the patterned masks 102A-102G. In this view, a deposition source (not shown) is provided for each of the chambers 105A-105G on the side of the patterned masks 102A-102G opposite the substrate.

Each of the patterned masks 102A-102G have a plurality of specific patterns 110A-110G. The patterns 110A-110G may be distinct to each of the patterned masks 102A-102G, but may be identical within each patterned mask 102A-102G. The patterns 110A-110G are utilized to control deposition of materials on the substrate. In the schematic view of FIG. 2, the substrate is not shown as the substrate will be above or below, or in front of or behind, each of the respective patterned masks 102A-102G. For purposes of the description, each chamber 105A-105G will include a substrate, which will be referred to as being below or behind each patterned mask 102A-102G. Each of the patterned masks 102A-102G may be dedicated to a respective chamber 105A-105G and the substrate may be transferred or moved relative to each patterned mask 102A-102G and chamber 105A-105G such that layers may be deposited sequentially. While only seven chambers 105A-105G are shown in FIG. 2, more or less chambers having a patterned mask therein may be provided in the deposition system 100.

Each of the patterned masks 102A-102G include a body 115 that surrounds the patterns 110A-110G. Each of the patterned masks 102A-102G also include an opening 120A-120G formed through the body 115. Each opening 120A-120G is formed at a different location on each mask 102A-102G. Each opening 120A-120G is also positioned in a peripheral edge region 125 of the body 115. The peripheral edge region 125 may be outside of the respective patterns 110A-110G.

During deposition in chamber 105A, a first film may be deposited on the substrate using the mask 102A. The first film will substantially conform with the pattern 110A on the substrate. Additionally, the first film will be deposited on the substrate according to the position of the opening 120A. Thereafter, the substrate is transferred or moved to the chamber 105B where a second film may be deposited on the substrate using the mask 102B. In some embodiments, another substrate may be transferred into the chamber 105A simultaneously for deposition of the first film using the mask 102A.

Before, during or after transfer or movement of the substrate having the first film thereon into the chamber 105B, one or more properties of the first film may be monitored. The properties of the first film include quantitative properties such as thickness measurement as well as qualitative properties such as chemical composition, dopant levels, and the like. Techniques for monitoring thickness include laser interferometry, spectral reflectometry or ellipsometry, among other suitable optical techniques. Techniques for qualitative property monitoring include Raman spectroscopy, laser fluorescence, ultra-violet light absorption techniques, among other suitable metrology techniques. Monitoring of the properties of the film corresponding to the position of the openings 120A-120G yields a metric of the film corresponding to the respective patterns 110A-110G. To accomplish the monitoring, a monitoring device (not shown) may be positioned adjacent to the substrate. Monitoring of the film properties is discussed in more detail below.

In the chamber 105B, after monitoring the first film, the second film is deposited on the substrate. The second film will substantially conform with the pattern 110B on the substrate. Additionally, the second film will be deposited on the substrate according to the position of the opening 120B. The second film may be the same or different than the first film. Before, during or after transfer or movement of the substrate having the second film thereon out of the chamber 105B, one or more properties of the second film is monitored. The monitoring may be performed in the same manner as described above in reference to the monitoring of the first film. The substrate may then have a third film deposited thereon in the chamber 105C utilizing the mask 105C. Monitoring of the third film may be performed as described above in reference to the first and second films. The deposition and monitoring processes may be repeated numerous times in the remaining chambers 105D-105G utilizing the respective patterned masks 102D-102G. Multiple films may then be formed on a substrate sequentially with the different patterned masks 102A-102G. The films may form film stacks having a thickness of about 100 nanometers. The film stacks may be formed from multiple layers of thin films formed in each of the chambers 105A-105G. Each layer in each chamber 105A-105G may include a thickness of about 20 to about 30 Angstroms, in one example.

In order to perform the monitoring, according to one embodiment, a monitoring device may be positioned to view the substrate, particularly the film corresponding to the position of the openings 120A-120G. A monitoring device may be housed within each of the chambers 105A-105G according to one embodiment. In another embodiment, a monitoring device may be positioned in between the chambers 105A-105G. In another embodiment, a monitoring device may be positioned outside of each of the chambers 105A-105G to view the substrate through a transparent window.

As discussed above, the monitoring device may be positioned to view a portion of the substrate having the film corresponding to the position of the openings 120A-120G in the patterned masks 102A-102G. In one embodiment, a monitoring device may be positioned between each of the chambers 105A-105G (either inside or outside of the chambers) and the newly deposited film may be monitored during transfer of the substrate therebetween. In another embodiment, each of the patterned masks 102B-102G include a second opening 130A-130F, respectively. Each of the second openings 130A-130F correspond to a position of the openings 120A-120G, respectively. According to this embodiment, newly deposited films may be monitored in a subsequent chamber utilizing a monitoring device in a position to view the respective second opening 130A-130F. For example, a first film deposited in the chamber 105A utilizing the mask 102A may be monitored in the chamber 105B. The monitoring may be performed before deposition of a second film in the chamber 105B. Similarly, a second film deposited in the chamber 105B utilizing the mask 102B may be monitored in the chamber 105C. The monitoring and deposition may be repeated in a similar manner in each successive chamber.

According to one aspect of this embodiment, a single film may be monitored in each chamber following deposition. Optionally or additionally, multiple films may be monitored at desired intervals in one or more of the chambers 105C-105G. For example, after the first film has been monitored in the chamber 105B via the second opening 130A, the second film may then be deposited over the first film according to the position of the second opening 130A. Similarly, after the second film has been monitored in the chamber 105C via the second opening 130B, a third film may then be deposited over the second film according to the position of the second opening 130B. This process may continue in the remaining chambers 105D-105G wherein a newly deposited film layer has another second layer deposited thereon in a subsequent deposition process.

If desired, the first film and the second film may be monitored utilizing a monitoring device positioned between the chambers 105B and 105C. Thus, the first film and the second film may be monitored during transfer of the substrate between the chambers 105B and 105C. Similarly, a second film layer and a third film layer may be monitored during transfer of the substrate between the chamber 105C and 105D. Other dual film layers may be monitored between subsequent chambers according to this embodiment.

As the films are monitored qualitatively and/or quantitatively in or between each chamber 105A-105G, qualities of the films and/or dual film stacks may be determined. If necessary, process parameters in the deposition system 100 may be adjusted based on the determined qualities. Thus, quality of the displays formed in the deposition system 100 may be assessed in-situ and corrections may be made if the quality is outside of specifications. In addition, if the measurements indicate that something has gone wrong, which cannot be corrected by adjusting a process parameter; then the system can be stopped and the necessary corrective intervention made before more substrates are erroneously deposited.

Figure 3:
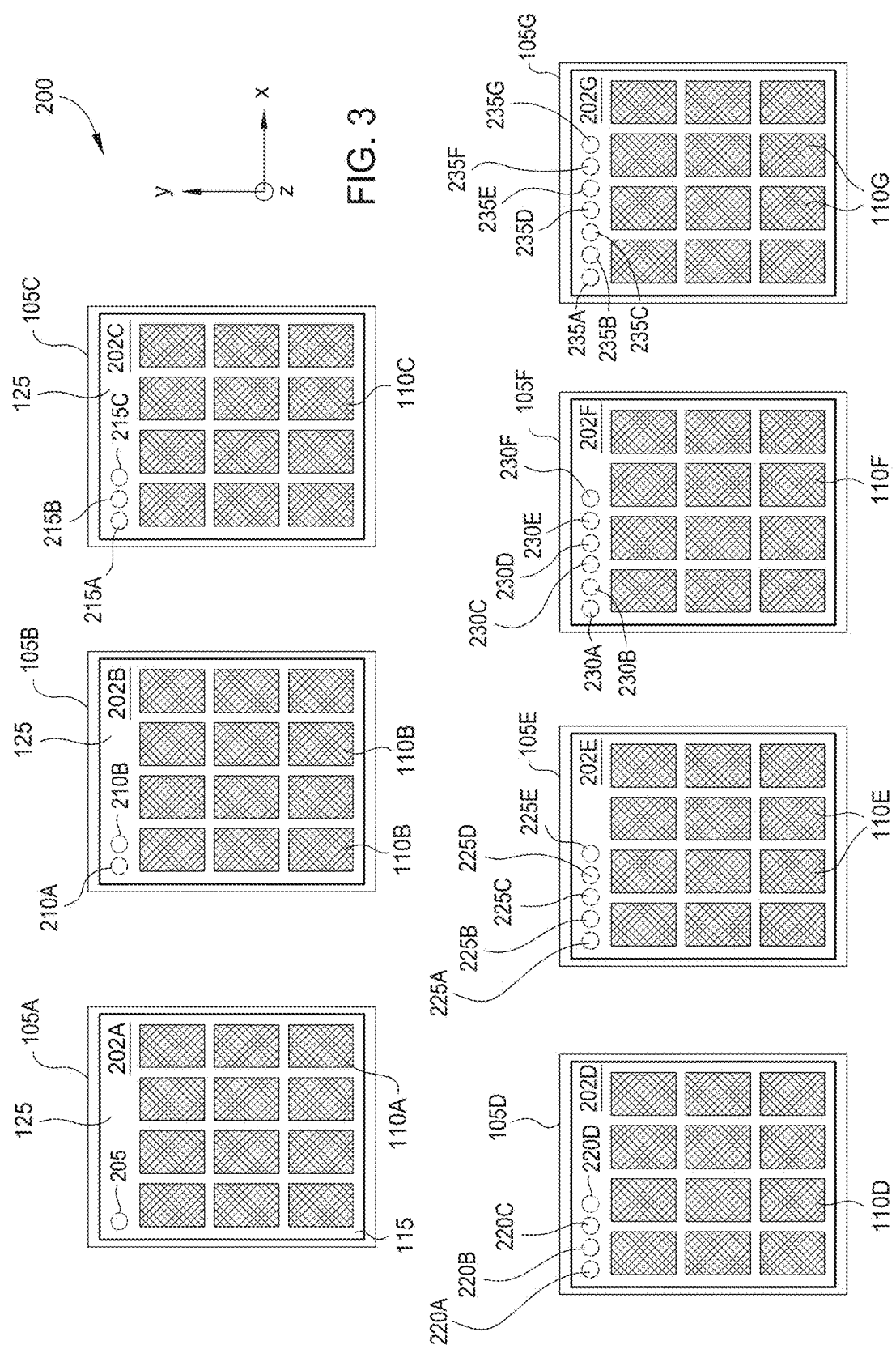
FIG. 3 is a schematic plan view of a deposition system according to another embodiment.

FIG. 3 is a schematic sectional view of a plurality of chambers 105A-105G that may be part of a deposition system 200 according to another embodiment. The deposition system 200 may include the plurality of chambers 105A-105G each having a respective patterned mask 202A-202G similar to FIG. 2. The sectional view of the chambers 105A-105G and the position of a substrate (not shown) and deposition source (not shown) may be similar to FIG. 2. The patterned masks 202A-202G are similar to the patterned masks 102A-102G described in FIG. 2 with the exception of additional openings as described below.

According to this embodiment, a first patterned mask 202A includes a first opening 205 formed through the body 115 of the first patterned mask 202A. A second patterned mask 202B includes a first opening 210A and second opening 210B formed through the body 115 of the second patterned mask 202B. The first opening 210A of the second patterned mask 202B generally corresponds to a position of the first opening 205 of the first patterned mask 202A. A third patterned mask 202C includes a first opening 215A, a second opening 215B and a third opening 215C formed through the body 115 of the third patterned mask 202C. The first opening 215A of the third patterned mask 202B generally corresponds to a position of the first opening 205 of the first patterned mask 202A as well as a position of the first opening 210A of the second patterned mask 202B. The second opening 215B generally corresponds to a position of the second opening 210B of the second patterned mask 202B.

A fourth patterned mask 202D includes a first opening 220A, a second opening 220B, a third opening 220C and a fourth opening 220D formed through the body 115 of the fourth patterned mask 202D. The first opening 220A of the fourth patterned mask 202D generally corresponds to a position of the first opening 205 of the first patterned mask 202A, a position of the first opening 210A of the second patterned mask 202B, and a position of the first opening 215A of the third patterned mask 202B. The second opening 220B generally corresponds to a position of the second opening 210B of the second patterned mask 202B as well as a position of the second opening 215B of the third patterned mask 202C. The third opening 220C generally corresponds to a position of the third opening 215C of the third patterned mask 202C.

A fifth patterned mask 202E includes a first opening 225A, a second opening 225B, a third opening 225C, a fourth opening 225D and a fifth opening 225E formed through the body 115 of the fifth patterned mask 202E. The first opening 225A generally corresponds to a position of the first opening 220A of the fourth patterned mask 202D (and positions of the first opening 205 of the first patterned mask 202A, the first opening 210A of the second patterned mask 202B, and the first opening 215A of the third patterned mask 202C). The second opening 225B generally corresponds to a position of the second opening 220B of the fourth patterned mask 202D (as well as positions of the second opening 210B of the second patterned mask 202B, and the second opening 215B of the third patterned mask 202B). The third opening 225C generally corresponds to a position of the third opening 220C of the third patterned mask 202C (as well as third openings in other patterned masks corresponding therewith). The fourth opening 225D generally corresponds to a position of the fourth opening 220D of the fourth patterned mask 202D.

The sixth patterned mask 202F includes a first opening 230A, a second opening 230B, a third opening 230C, a fourth opening 230D, a fifth opening 230E, a sixth opening 230F and a sixth opening 230F formed through the body 115 of the sixth patterned mask 202F. The first opening 230A generally corresponds to a position of the first opening 225A of the fifth patterned mask 202E (as well as first openings in other patterned masks corresponding therewith). The second opening 230B generally corresponds to a position of the second opening 225B of the fifth patterned mask 202E (as well as second openings in other patterned masks corresponding therewith). The third opening 230C generally corresponds to a position of the third opening 225C of the fifth patterned mask 202E (as well as third openings in other patterned masks corresponding therewith). The fourth opening 230D generally corresponds to a position of the fourth opening 225D of the fifth patterned mask 202E (as well as fourth openings in other patterned masks corresponding therewith). The fifth opening 230E generally corresponds to a position of the fifth opening 225E of the fifth patterned mask 202E.

The seventh patterned mask 202G includes a first opening 235A—a seventh opening 235G formed through the body 115 of the seventh patterned mask 202G. The first opening 235A generally corresponds to a position of the first opening 230A of the sixth patterned mask 202F (as well as first openings in other patterned masks corresponding therewith). The second opening 235B generally corresponds to a position of the second opening 230B of the sixth patterned mask 202F (as well as second openings in other patterned masks corresponding therewith). The third opening 235C generally corresponds to a position of the third opening 230C of the sixth patterned mask 202F (as well as third openings in other patterned masks corresponding therewith). The fourth opening 235D generally corresponds to a position of the fourth opening 230D of the sixth patterned mask 202F (as well as fourth openings in other patterned masks corresponding therewith). The fifth opening 235E generally corresponds to a position of the fifth opening 230E of the sixth patterned mask 202F (as well as a position of the fifth opening 225E of the fifth patterned mask 202E). The sixth opening 235F generally corresponds to a position of the sixth opening 230F of the sixth patterned mask 202F.

According to this embodiment, a single film may be monitored in each chamber following deposition similar to one of the embodiments described in FIG. 2. Optionally or additionally, multiple films may be monitored at desired intervals in one or more of the chambers 105C-105G. For example, after the first film has been monitored in the chamber 105B via the first opening 210A, the second film may then be deposited over the first film according to the position of the second opening 210B. Similarly, after the second film has been monitored in the chamber 105C via the second opening 215B, a third film may then be deposited over the second film according to the position of the third opening 215C.

After deposition of the third film in the chamber 105C, the substrate may be moved or transferred to the chamber 105D. If desired, the first, the second and the third film may be monitored utilizing the first opening 220A of the fourth patterned mask 202D. Thereafter, a fourth film may be deposited utilizing the fourth patterned mask 202D. After deposition of the fourth film in the chamber 105D, the substrate may be moved or transferred to the chamber 105E.

If desired, the first, the second, the third film and the fourth film may be monitored utilizing the first opening 225A of the fifth patterned mask 202E. Thereafter, a fifth film may be deposited utilizing the fifth patterned mask 202E. This process may continue in the remaining chambers 105F-105G wherein a newly deposited film layer has another layer deposited thereon in a subsequent deposition process. Additionally, many combinations of layers may be monitored in the chambers 105C-105G. For example, a second film deposited in the chamber 105B and a third film deposited in the chamber 105C may be monitored in the chamber 105D. A monitoring device within the chamber 105D may utilize the second opening 220B of the fourth patterned mask 202D to monitor the films. Alternatively, the films may be monitored via the second opening 220B of the fourth patterned mask 202D during transfer of the substrate between the chambers 105C and 105D. Similarly, a third film, a fourth film, a fifth film and a sixth film may be monitored utilizing the third opening 235C of the seventh patterned mask 202G. The films may be monitored utilizing a monitoring device in the chamber 105G or in between the chambers 105F and 105G.

As the films are monitored qualitatively and/or quantitatively in or between each chamber 105A-105G, qualities of the films and/or the film stacks may be determined during fabrication. If necessary, process parameters in the deposition system 200 may be adjusted based on the determined qualities. Thus, quality of the displays formed in the deposition system 200 may be assessed in-situ and corrections may be made if the quality is outside of specifications.

Figure 4:
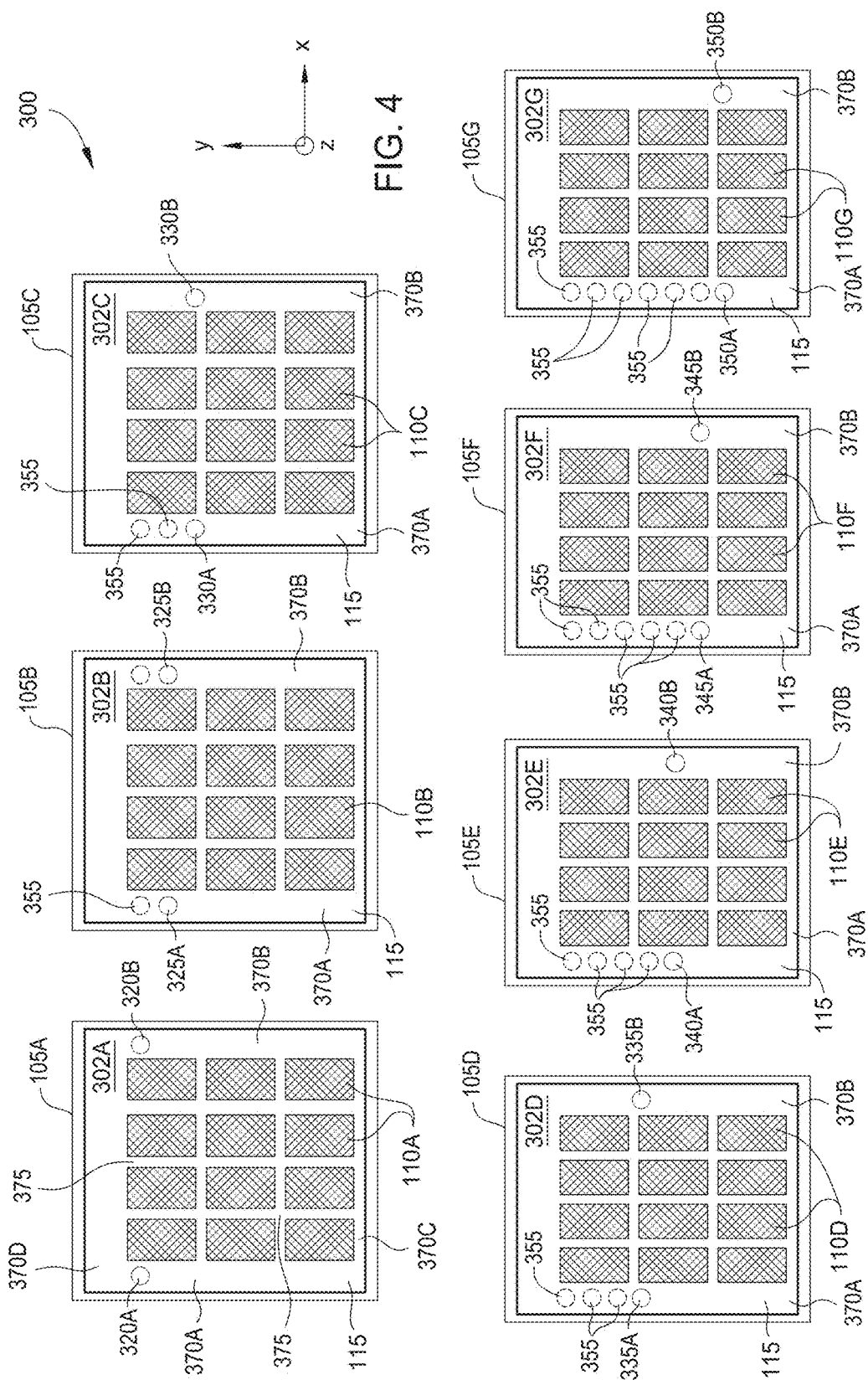
FIG. 4 is a schematic plan view of a deposition system according to another embodiment.

FIG. 4 is a schematic sectional view of a plurality of chambers 105A-105G that may be part of a deposition system 300 according to another embodiment. The deposition system 300 may include the plurality of chambers 105A-105G each having a respective patterned mask 302A-302G similar to FIGS. 2 and 3. The sectional view of the chambers 105A-105G and the position of a substrate (not shown) and deposition source (not shown) may be similar to FIGS. 2 and 3. The patterned masks 302A-302G are similar to the patterned masks 102A-102G described in FIG. 2 with the exception of a different configuration of openings as described below.

According to this embodiment, a first patterned mask 302A includes a first opening 320A and a second opening 320B formed through the body 115 of the first patterned mask 302A. Similarly, each of the remaining second through seventh of the patterned masks 302B-302G include a respective first opening 325A, 330A, 335A, 340A, 345A and 350A and a respective second opening 325B, 330B, 335B, 340B, 345B and 350B. Each pair of openings on each patterned mask (e.g., the first opening 320A and the second opening 320B of the first patterned mask 302A, etc.) is laterally offset (in the Y direction) from other pairs of openings. For example, the first opening 320A and the second opening 320B of the first patterned mask 302A may be coplanar along the X direction. However, the first opening 325A and the second opening 325B of the second patterned mask 302B are offset from the first opening 320A and the second opening 320B. This lateral offset repeats for subsequent patterned masks 302C-302G. For the sake of brevity, only the first opening 320A and the second opening 320B of the first patterned mask 302A will be described in detail. Other first and second openings of the remaining second through seventh of the patterned masks 302B-302G may be configured similarly with the exception of the lateral offset.

The first opening 320A and the second opening 320B may be disposed outside of the patterns 110A of the first patterned mask 302A. In one embodiment, each of the first opening 320A and the second opening 320B are formed through the body 115 at a peripheral edge 370A, 370B, respectively. The first opening 320A may be formed through the body 115 in a position that opposes a position of the second opening 320B. The first opening 320A and the second opening 320B may be utilized to provide deposition of a first film on a substrate when utilizing the first patterned mask 302A in the chamber 105A. Thereafter, the first film may be monitored in the chamber 105B or in between the chambers 105A and 105B according to embodiments described in more detail above. Subsequent films formed in the chambers 105B-105G may be monitored similarly.

According to this embodiment, it is possible to obtain a single axis metric of film uniformity (e.g., along the X axis). Extrinsic properties such as film thickness uniformity may be obtained in addition to the intrinsic film property uniformity as described above.

While not shown, additional openings may be provided on peripheral edges 370C, 370D (shown on the first patterned mask 302A) adjacent to the edges 370A, 370B of the body 115. According to this embodiment, a dual axis uniformity metric of film uniformity may be obtained (e.g., along the X direction and the Y direction). Alternatively or additionally, openings (not shown) may be formed through the body 115 of the first patterned mask 302A in areas 375 between the patterns 110A (shown on the first patterned mask 302A).

In another embodiment, optional openings 355 (shown in phantom) may be formed through the bodies 115 of each of the patterned masks 302B-302G. The openings 355 may be positioned adjacent to the first openings 325A, 330A, 335A, 340A, 345A and 350A. In an alternate or additional embodiment (not shown), openings similar to the openings 355 may be formed adjacent to the second openings 325B, 330B, 335B, 340B, 345B and 350B. The openings 350 may be utilized to monitor single films or stacks of films according to the embodiment described in FIG. 3. For example, the opening 355 in the patterned mask 302B may be positioned to generally correspond to a position of the first opening 320A of the first patterned mask 302A. Other openings 355 in subsequent patterned masks 302C-302G may be positioned to generally correspond to a position of other first openings 325A, 330A, 335A, 340A and 345A.

Figure 5:
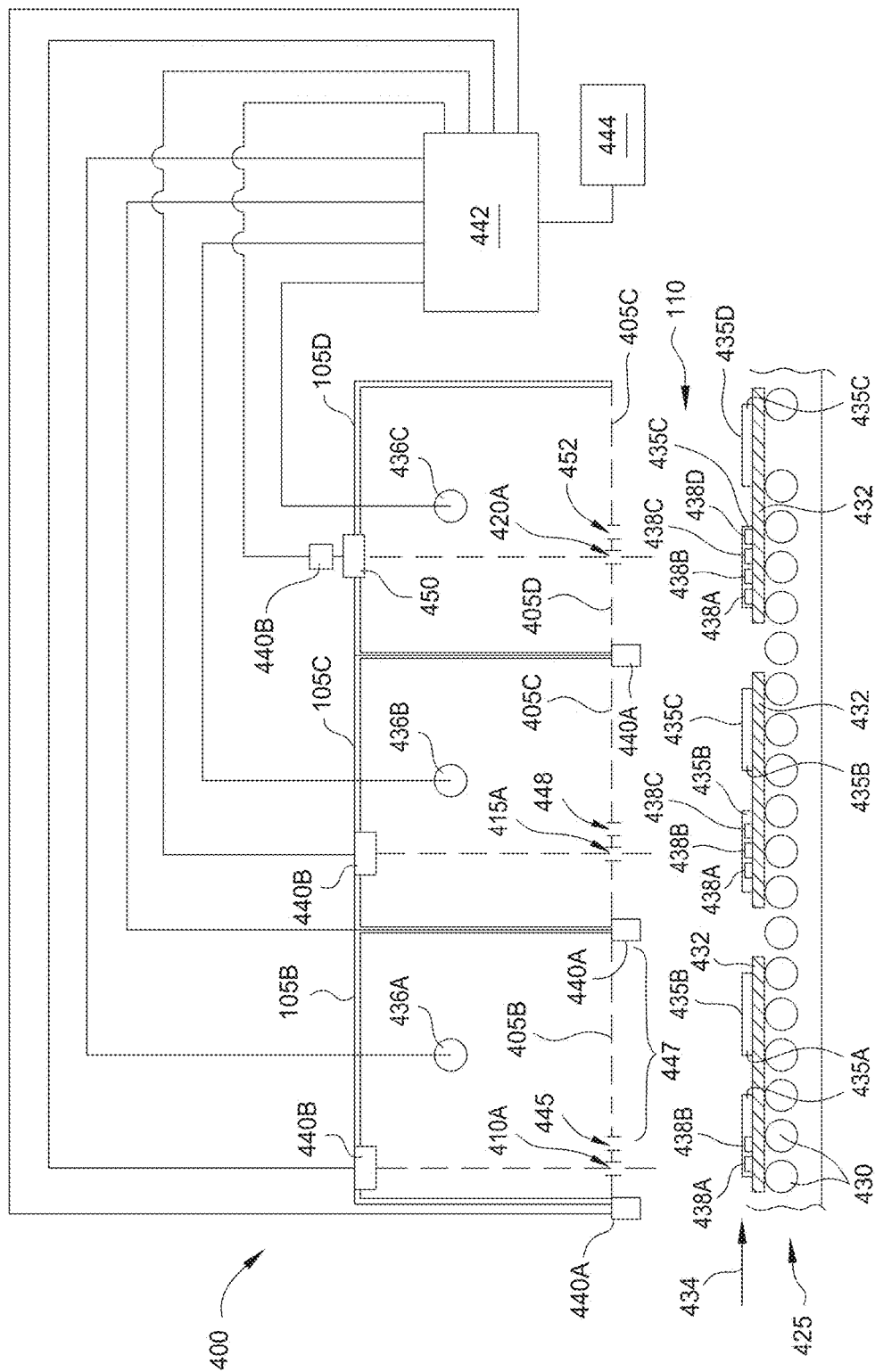
FIG. 5 is a schematic side cross-sectional view of a portion of a linear deposition system according to another embodiment.

FIG. 5 is a schematic side cross-sectional view of a portion of a deposition system 400 according to another embodiment. The deposition system 400 according to this embodiment is a horizontal in-line deposition tool. The deposition system 400 includes a plurality of deposition chambers 105B-105D. Each deposition chamber 105B-105D includes a patterned mask, such as a second patterned mask 405B, a third patterned mask 405C, and a fourth patterned mask 405D. According to this embodiment, a first substrate, such as a substrate 432, is provided to the deposition chamber 105B having a first film layer 435A formed thereon. The first film layer 435A may be formed by a patterned mask such as the patterned mask 102A (shown in FIG. 2), the patterned mask 202A (shown in FIG. 3) or the patterned mask 302A (shown in FIG. 4). The deposition system 400 may include many other deposition chambers each having a patterned mask but are not shown in order to focus on details of the deposition system 400.

The second patterned mask 405B, the third patterned mask 405C, and the fourth patterned mask 405D may be similar to any of the patterned masks 102B-102G (shown in FIG. 2), the patterned masks 202B-202G (shown in FIG. 3), or the patterned masks 302B-302G (shown in FIG. 4). Each of the second patterned mask 405B, the third patterned mask 405C, and the fourth patterned mask 405D include at least a first opening 410A, 415A and 420A, respectively. The deposition system 400 includes a conveyor system 425. The conveyor system 425 includes a plurality of rollers 430 that supports one or more substrates, such as a first substrate 432. The substrate 432 may be moved within the deposition system 400 along a direction 434, for example.

According to this embodiment, the substrate 432 is provided to the deposition chamber 105B having the first film layer 435A formed thereon. At least a portion 438A of the first film layer 435A is provided on the substrate 432 through an opening formed in the patterned mask outside of a pattern area of the patterned mask. The substrate 432 within chambers 105C and 105D is the same substrate shown within chamber 105B with the exception of additional film layers. Thus, for illustrative purposes, one substrate 432 is shown in the deposition system 400 at different stages of production. However, an actual deposition system such as the deposition system 400 may process multiple substrates simultaneously. For example, an actual deposition system may process multiple substrates serially and/or in parallel.

In one embodiment, a monitoring device 440A is mounted at a periphery of the deposition chamber 105B. The portion 438A of the first film layer 435A may be monitored by the monitoring device 440A as the substrate 432 passes the monitoring device 440A when the substrate 432 moves in the direction 434 enroute to the deposition chamber 105B. Alternatively, a monitoring device 440B may be disposed in the deposition chamber 105B. According to this embodiment, the substrate 432 may be positioned with respect to the second patterned mask 405B. The monitoring device 440B may view the portion 438A of the first film layer 435A via the first opening 410A. The monitoring devices 440A and 440B may be a laser interferometer, spectral reflectometer, a spectral ellipsometry device, or other suitable optical metrology device. The monitoring devices 440A and 440B may also include a Raman spectroscopy device, a laser fluorescence device, an ultra-violet light absorption device, an electron and/or on layer inspection tool, or other suitable metrology device. Each of the monitoring devices 440A and 440B are coupled to a controller 442. The controller 442 may be connected with a user interface 444 that displays information from the monitoring devices 440A and 440B to a user. The user interface 444 may also allow a user to change process parameters based on the information from the monitoring devices 440A and 440B.

Each of the deposition chambers 105B-105D include a deposition source 436A-436C. A first deposition source 436A may be utilized to deposit a second film layer 435B onto the substrate 432. The second film layer 435B may be deposited utilizing the second patterned mask 405B. At least a portion 438B of the second film layer 435B is provided on the substrate 432 through an opening 445 formed in the second patterned mask 405B outside of a pattern area of the second patterned mask 405B.

Similar to the embodiment described above, the portion 438B of the second film layer 435B may be monitored by the monitoring device 440A disposed between the deposition chambers 105B and 105C. The portion 438B of the second film layer 435B may be monitored during transfer of the substrate 432 from the deposition chamber 105B to the deposition chamber 105C. Alternatively, the portion 438B of the second film layer 435B may be monitored by the monitoring device 440B via the first opening 415A similar to the embodiment described above. Thereafter, a third film layer 435C may be deposited onto the substrate 432 by a second deposition source 436B. The third film layer 435C may be deposited utilizing the third patterned mask 405C. At least a portion 438C of the third film layer 435C is provided on the substrate 432 through an opening 448 formed in the third patterned mask 405C outside of a pattern area of the third patterned mask 405C.

Monitoring of the portion 438C of the third film layer 435C may be performed by the monitoring device 440A disposed between the deposition chambers 105C and 105D during transfer of the substrate 432 from the deposition chamber 105C to the deposition chamber 105D. Alternatively, the portion 438C of the third film layer 435C may be monitored by the monitoring device 440B via the first opening 420A similar to the embodiment described above. However, the monitoring device 440B is disposed outside of the deposition chamber 105D according to one embodiment. A transparent window 450 may be provided in a sidewall of the deposition chamber 105D. The transparent window 450 may be in between the monitoring device 440B and the portion 438C of the third film layer 435C. The transparent window 450 may also be substantially aligned with the first opening 420A of the third patterned mask 405C. Thereafter, a fourth film layer 435D may be deposited onto the substrate 432 by a third deposition source 436C. The fourth film layer 435D may be deposited utilizing the fourth patterned mask 405D. At least a portion 438D of the fourth film layer 435D is provided on the substrate 432 through an opening 452 formed in the fourth patterned mask 405D outside of a pattern area 447 of the fourth patterned mask 405D. The portion 438D of the fourth film layer 435D may be monitored in between the deposition chamber 105D and a subsequent deposition chamber (not shown) or within the subsequent deposition chamber according to embodiments described above. The deposition and monitoring process may be repeated multiple times.

Figure 6:
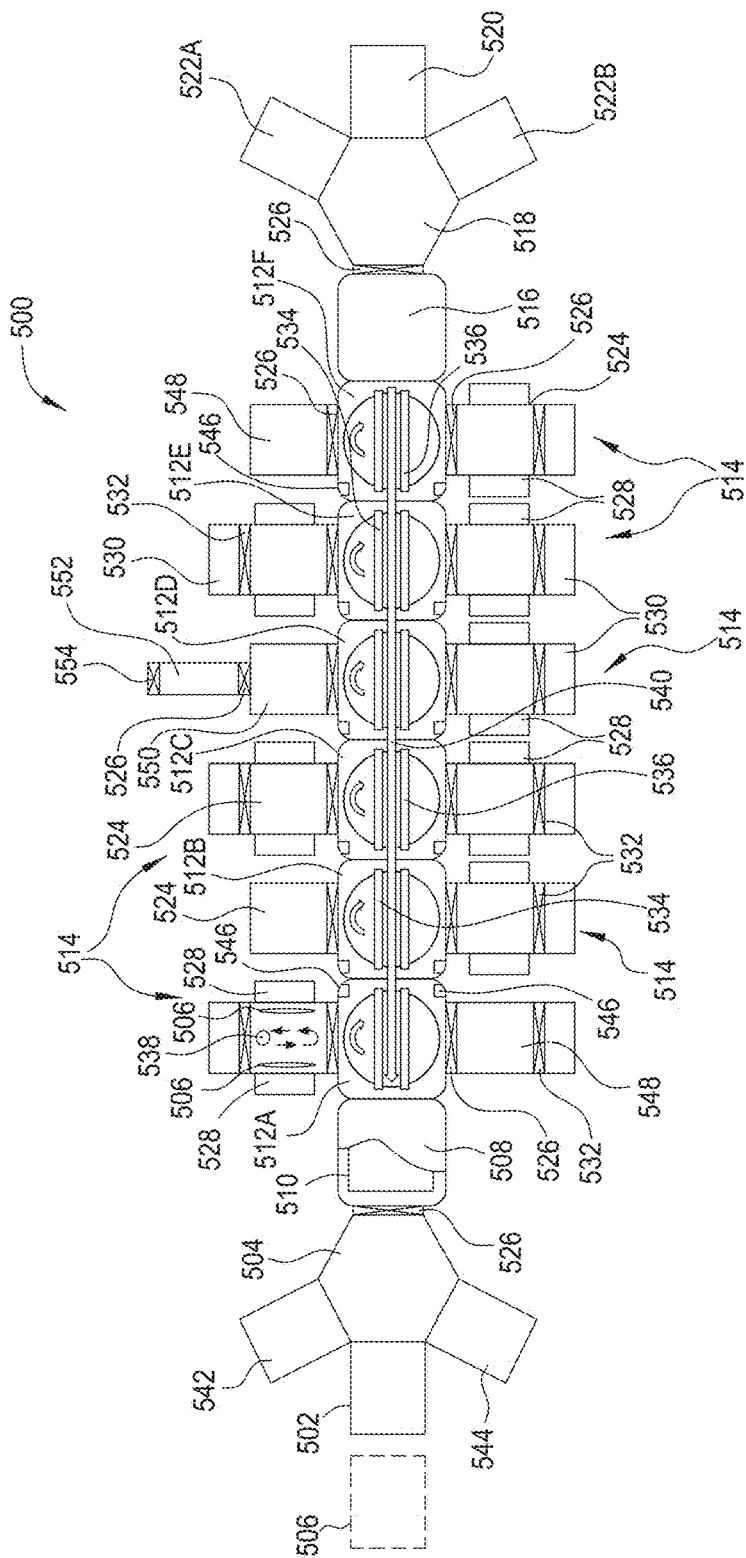
FIG. 6 is a schematic plan view of a manufacturing system according to one embodiment.

FIG. 6 is a schematic plan view of a manufacturing system 500 according to one embodiment. The system 500 may be used for manufacturing electronic devices, particularly electronic devices including organic materials therein. For example, the devices can be electronic devices or semiconductor devices, such as optoelectronic devices and, in particular, displays.

Embodiments described herein particularly relate to deposition of materials, for example, for display manufacturing on large area substrates. The substrates in the manufacturing system 500 may be moved throughout the manufacturing system 500 on carriers that may support one or more substrates at edges thereof, by electrostatic attraction, or combinations thereof. According to some embodiments, large area substrates or carriers supporting one or more substrates, for example large area carriers, may have a size of at least 0.174 m$^2$. Typically, the size of the carrier can be about 1.4 m$^2$ to about 8 m$^2$, more typically about 2 m$^2$ to about 9 m$^2$ or even up to 12 m$^2$. Typically, the rectangular area, in which the substrates are supported and for which the holding arrangements, apparatuses, and methods according to embodiments described herein are provided, are carriers having sizes for large area substrates as described herein. For instance, a large area carrier, which would correspond to an area of a single large area substrate, can be GEN 5, which corresponds to about 1.4 m$^2$ substrates (1.1 m×1.3 m), GEN 7.5, which corresponds to about 4.29 m$^2$ substrates (1.95 m×2.2 m), GEN 8.5, which corresponds to about 5.7 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented.

According to typical embodiments, which can be combined with other embodiments described herein, the substrate thickness can be from 0.1 to 1.8 mm and the holding arrangement, and particularly the holding devices, can be adapted for such substrate thicknesses. However, particularly the substrate thickness can be about 0.9 mm or below, such as 0.5 mm or 0.3 mm, and the holding arrangement, and particularly the holding devices, are adapted for such substrate thicknesses. Typically, the substrate may be made from any material suitable for material deposition. For instance, the substrate may be made from a material selected from the group consisting of glass (for instance soda-lime glass, borosilicate glass etc.), metal, polymer, ceramic, compound materials, carbon fiber materials or any other material or combination of materials which can be coated by a deposition process.

The manufacturing system 500 shown in FIG. 6 includes a load lock chamber 502, which is connected to a horizontal substrate handling chamber 504. A substrate 506 (outlined in dashed lines), such as a large area substrate as described above, can be transferred from the substrate handling chamber 504 to a vacuum swing module 508. The vacuum swing module 508 loads the substrate 506 in a horizontal position on a carrier 510. After loading the substrate 506 on the carrier 510 in the horizontal position, the vacuum swing module 508 rotates the carrier 510 having the substrate 506 provided thereon in a vertical or substantially vertical orientation. The carrier 510 having the substrate 506 provided thereon is then transferred through a first transfer chamber 512A and at least one subsequent transfer chamber (512B-512F) in the vertical orientation. One or more deposition apparatuses 514 can be connected to the transfer chambers. Further, other substrate processing chambers or other vacuum chambers can be connected to one or more of the transfer chambers. After processing of the substrate 506, the carrier having a substrate 506 thereon is transferred from the transfer chamber 512F into an exit vacuum swing module 516 in the vertical orientation. The exit vacuum swing module 516 rotates the carrier having a substrate 506 thereon from the vertical orientation to a horizontal orientation. Thereafter, the substrate 506 can be unloaded into an exit horizontal glass handling chamber 518. The processed substrate 506 may be unloaded from the manufacturing system 500 through load lock chamber 520, for example, after the manufactured device is encapsulated in one of a thin-film encapsulation chambers 522A or 522B.

In FIG. 6, a first transfer chamber 512A, a second transfer chamber 512B, a third transfer chamber 512C, a fourth transfer chamber 512D, a fifth transfer chamber 512E, and a sixth transfer chamber 512F are provided. According to embodiments described herein, at least two transfer chambers are included in a manufacturing system, and typically 2 to 8 transfer chambers can be included in the manufacturing system. Several deposition apparatuses, for example 9 deposition apparatuses 514 in FIG. 6, each having a deposition chamber 524 and each being exemplarily connected to one of the transfer chambers are provided. According to some embodiments, one or more of the deposition chambers of the deposition apparatuses are connected to the transfer chambers via gate valves 526.

At least a portion of the deposition chambers 524 include a patterned mask (not shown) as described herein. Each of the patterned masks may be similar to any of the patterned masks 102B-102G (shown in FIG. 2), the patterned masks 202B-202G (shown in FIG. 3), or the patterned masks 302B-302G (shown in FIG. 4). Each of the deposition chambers 524 also include a deposition source 538 (only one is shown) to deposit film layers on at least one substrate 506. In some embodiments, the deposition source 538 comprises an evaporation module and a crucible. In further embodiments, the deposition source 538 may be movable in the direction indicated by arrows in order to deposit a film on two substrates 506 supported on a respective carrier (not shown). Deposition is performed on the substrates 506 as the substrates 506 are in a vertical orientation or a substantially vertical orientation with a respective patterned mask between the deposition source 538 and each substrate 506. Each of the patterned masks include at least a first opening as described above. The first opening may be utilized to deposit a portion of a film layer outside of a pattern area of the patterned mask as described in detail above. The transfer chambers 512A-512F may include monitoring devices 546, which may be similar to the monitoring devices 440A and/or 440B described above. The monitoring devices 546 may be utilized to monitor the portion of the film layer deposited outside of the pattern area of the patterned masks during transfer of the substrate 506.

Alignment units 528 can be provided at the deposition chambers 524 for aligning substrates relative to the respective patterned mask. According to yet further embodiments, vacuum maintenance chambers 530 can be connected to the deposition chambers 524, for example via gate valve 532. The vacuum maintenance chambers 530 allow for maintenance of deposition sources in the manufacturing system 500.

As shown in FIG. 6, the one or more transfer chambers 512A-512F are provided along a line for providing an in-line transportation system. According to some embodiments, a dual track transportation system is provided. The dual track transportation system includes a first track 534 and a second track 536 in each of the transfer chambers 512A-512F. The dual track transportation system may be utilized to transfer carriers 510 supporting substrates, along at least one of the first track 534 and the second track 536.

According to yet further embodiments, one or more of the transfer chambers 512A-512F are provided as a vacuum rotation module. The first track 534 and the second track 536 can be rotated at least 90 degrees, for example 90 degrees, 180 degrees or 360 degrees. The carriers, such as the carrier 510, moves linearly on the tracks 534 and 536. The carriers may be rotated in a position to be transferred into one of the deposition chambers 524 of the deposition apparatuses 514, or one of the other vacuum chambers described below. The transfer chambers 512A-512F are configured to rotate the vertically oriented carriers and/or substrates, wherein, for example, the tracks in the transfer chambers are rotated around a vertical rotation axis. This is indicated by the arrows in the transfer chambers 512A-512F of FIG. 6.

According to some embodiments, the transfer chambers are vacuum rotation modules for rotation of a substrate under a pressure below 10 mbar. According to yet further embodiments, another track is provided within the two or more transfer chambers (512A-512F), wherein a carrier return track 540 is provided. According to typical embodiments, the carrier return track 540 can be provided between the first track 534 and second track 536. The carrier return track 540 allows for returning empty carriers from the further the exit vacuum swing module 516 to the vacuum swing module 508 under vacuum conditions. Returning the carriers under vacuum conditions and, optionally under controlled inert atmosphere (e.g. Ar, N2 or combinations thereof) reduces the carriers exposure to ambient air. Contact with moisture can therefore be reduced or avoided. Thus, the outgassing of the carriers during manufacturing of the devices in the manufacturing system 500 can be reduced. This may improve the quality of the manufactured devices and/or the carriers can be in operation without being cleaned for an extended time period.

FIG. 6 further shows a first pretreatment chamber 542 and a second pretreatment chamber 544. A robot (not shown) or another suitable substrate handling system can be provided in the substrate handling chamber 504. The robot or other substrate handling system can load the substrate 506 from the load lock chamber 502 in the substrate handling chamber 504 and transfer the substrate 506 into one or more of the pretreatment chambers (542, 544). For example, the pretreatment chambers can include a pretreatment tool selected from the group consisting of: plasma pretreatment of the substrate, cleaning of the substrate, UV and/or ozone treatment of the substrate, on source treatment of the substrate, RF or microwave plasma treatment of the substrate, and combinations thereof. After pretreatment of the substrates, the robot or other handling system transfers the substrate out of pretreatment chamber via the substrate handling chamber 504 into the vacuum swing module 508. In order to allow for venting the load lock chamber 502 for loading of the substrates and/or for handling of the substrate in the substrate handling chamber 504 under atmospheric conditions, a gate valve 526 is provided between the substrate handling chamber 504 and the vacuum swing module 508. Accordingly, the substrate handling chamber 504, and if desired, one or more of the load lock chamber 502, the first pretreatment chamber 542 and the second pretreatment chamber 544, can be evacuated before the gate valve 526 is opened and the substrate is transferred into the vacuum swing module 508. Accordingly, loading, treatment and processing of substrates may be conducted under atmospheric conditions before the substrate is loaded into the vacuum swing module 508.

According to embodiments described herein, loading, treatment and processing of substrates, which may be conducted before the substrate is loaded into the vacuum swing module 508, is conducted while the substrate is horizontally oriented or essentially horizontally oriented. The manufacturing system 500 as shown in FIG. 6, and according to yet further embodiments described herein, combines a substrate handling in a horizontal orientation, a rotation of the substrate in a vertical orientation, material deposition onto the substrate in the vertical orientation, a rotation of the substrate in a horizontal orientation after the material deposition, and an unloading of the substrate in a horizontal orientation.

The manufacturing system 500 shown in FIG. 6, as well as other manufacturing systems described herein, include at least one thin-film encapsulation chamber. FIG. 6 shows a first thin-film encapsulation chamber 522A and a second thin-film encapsulation chamber 522B. The one or more thin-film encapsulation chambers include an encapsulation apparatus, wherein the deposited and/or processed layers, particularly an OLED material, are encapsulated between, i.e. sandwiched between, the processed substrate and another substrate in order to protect the deposited and/or processed material from being exposed to ambient air and/or atmospheric conditions. Typically, the thin-film encapsulation can be provided by sandwiching the material between two substrates, for example glass substrates. However, other encapsulation methods like lamination with glass, polymer or metal sheets, or laser fusing of a cover glass may alternatively be applied by an encapsulation apparatus provided in one of the thin-film encapsulation chambers. In particular, OLEO material layers may suffer from exposure to ambient air and/or oxygen and moisture. Accordingly, the manufacturing system 500, for example as shown in FIG. 6, can encapsulate the thin films before unloading the processed substrate via the exit load lock chamber 520.

According to yet further embodiments, the manufacturing system can include a carrier buffer 548. For example, the carrier buffer 548 can be connected to the first transfer chamber 512A, which is connected to the vacuum swing module 508 and/or the last transfer chamber, i.e. the sixth transfer chamber 512F. For example, the carrier buffer 548 can be connected to one of the transfer chambers, which is connected to one of the vacuum swing modules. Since the substrates are loaded and unloaded in the vacuum swing modules, it is beneficial if the carrier buffer 548 is provided close to a vacuum swing module. The carrier buffer 548 is configured to provide the storage for one or more, for example 5 to 30, carriers. The carriers in the buffer can be used during operation of the manufacturing system 500 in the event another carrier needs to be replaced, for example for maintenance, such as cleaning.

According to yet further embodiments, the manufacturing system can further include a mask shelf 550, i.e. a mask buffer. The mask shelf 550 is configured to provide storage for replacement patterned masks and/or masks, which need to be stored for specific deposition steps. According to methods of operating a manufacturing system 500, a mask can be transferred from the mask shelf 550 to a deposition apparatus 514 via the dual track transportation arrangement having the first track 534 and the second track 536. Thus, a mask in a deposition apparatus can be exchanged either for maintenance, such as cleaning, or for a variation of a deposition pattern without venting a deposition chamber 524, without venting a transfer chambers 512A-512F, and/or without exposing the mask to atmospheric conditions.

FIG. 6 further shows a mask cleaning chamber 552. The mask cleaning chamber 552 is connected to the mask shelf 550 via gate valve 526. Accordingly, a vacuum tight sealing can be provided between the mask shelf 550 and the mask cleaning chamber 552 for cleaning of a mask. According to different embodiments, the mask can be cleaned within the manufacturing system 500 by a cleaning tool, such as a plasma cleaning tool. A plasma cleaning tool can be provided in the mask cleaning chamber 552. Additionally or alternatively, another gate valve 554 can be provided at the mask cleaning chamber 552, as shown in FIG. 6. Accordingly, a mask can be unloaded from the manufacturing system 500 while only the mask cleaning chamber 552 needs to be vented. By unloading the mask from the manufacturing system, an external mask cleaning can be provided while the manufacturing system continues to be fully operating. FIG. 6 illustrates the mask cleaning chamber 552 adjacent to the mask shelf 550. A corresponding or similar cleaning chamber (not shown) may also be provided adjacent to the carrier buffer 548. By providing a cleaning chamber adjacent to the carrier buffer 548, the carrier may be cleaned within the manufacturing system 500 or can be unloaded from the manufacturing system through the gate valve connected to the cleaning chamber.

Figure 7:
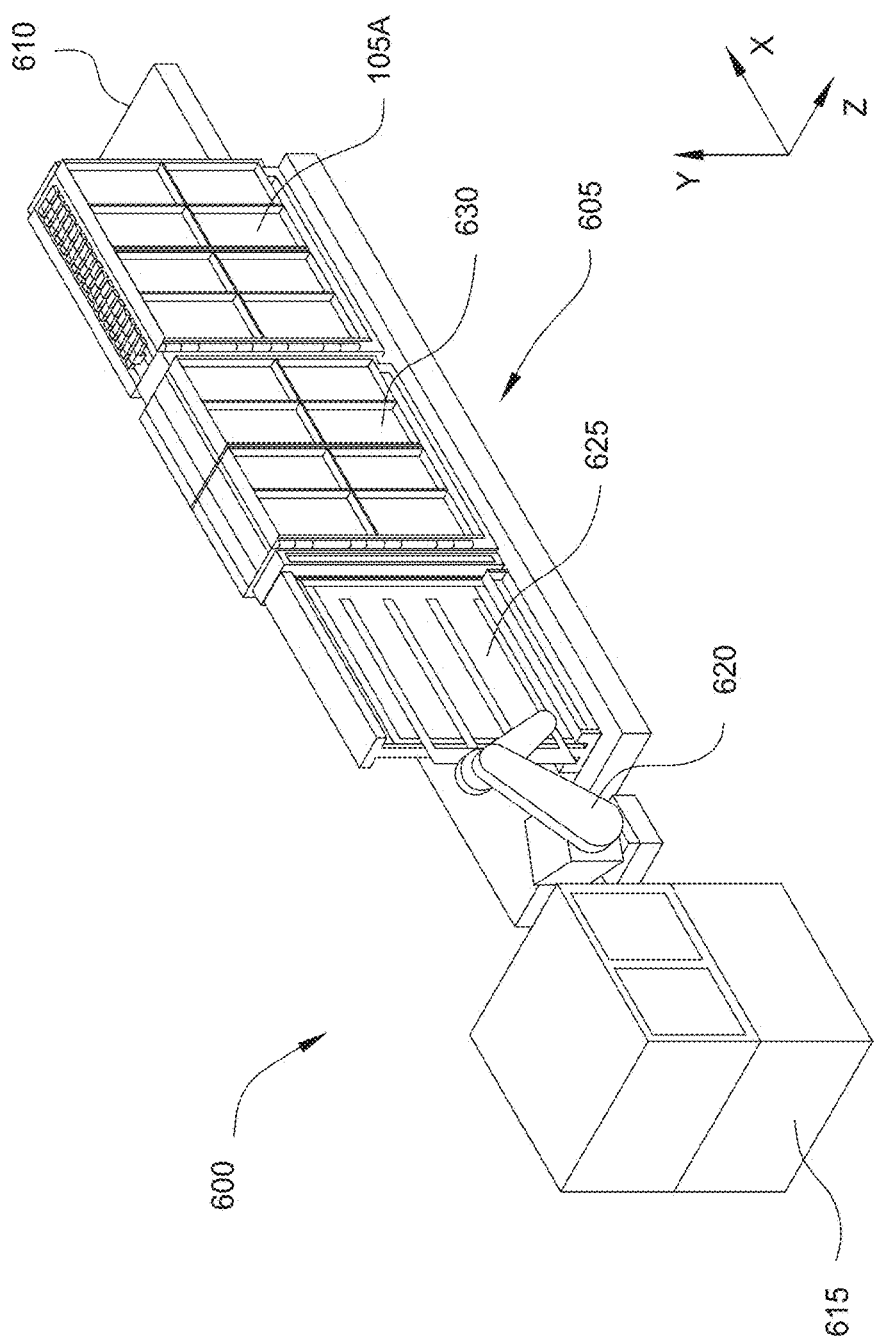
FIG. 7 is a schematic isometric view of a linear deposition system according to another embodiment.

FIG. 7 is a schematic isometric view of a deposition system 600 according to another embodiment. The deposition system 600 according to this embodiment is a vertical, linear deposition tool. The deposition system 600 may be sized to process substrates having a surface area of greater than about 90,000 mm$^2$ and able to process more than 45 substrates per hour. The deposition system 600 includes a process line 605 that may include a common system control platform 610. The process line 605 includes a substrate stacking module 615 from which fresh substrates (i.e., substrates which have not yet been processed within the deposition system 600 are retrieved and processed substrates are stored. An atmospheric robot 620 may be utilized to retrieve substrates from the substrate stacking module 615 and place the substrates into a substrate loading station 625. It is to be understood that while the substrate stacking module 615 is shown having substrates stacked in a horizontal orientation, substrates disposed in the substrate stacking module 615 may be maintained in a vertical orientation similar to how the substrates are held in the substrate loading station 625. A fresh substrate is then moved into a substrate load lock chamber 630 and then to a chamber 105A. While not shown, the chamber 105A includes a deposition source and a patterned mask similar to the patterned masks described above. Additionally, while not shown, the deposition system 600 includes additional chambers, such as the chambers 105B-105G, described above. The additional chambers include a deposition source and dedicated patterned mask as described above. The deposition system 600 may include a load lock chamber and a loading station disposed at the end of the last chamber (both not shown). Once the substrates are processed in the chambers of the deposition system 600, the substrates may be removed through the load lock chamber and the substrate loading station where it is retrieved by another atmospheric robot (not shown) and returned to a substrate stacking modules (not shown).

While the foregoing is directed to embodiments of the present disclosure, other and further embodiments of the invention may be devised without departing from the basic scope thereof. Therefore, the scope of the present disclosure is determined by the claims that follow.

We claim:

1. A deposition system, comprising:
   at least two deposition chambers; and
   a patterned mask for each of the deposition chambers, wherein:
   a first mask of the patterned masks has a first opening formed through a peripheral edge region of the first mask outside of a pattern formed thereon;
   a second mask of the patterned masks has a first opening formed through a peripheral edge region of the second mask outside of a pattern formed thereon, the first opening of the second mask having a position on the second mask that is different than a position of the first opening on the first mask; and
   a monitoring device is coupled to one of the at least two deposition chambers, the monitoring device positioned to view the peripheral edge region of one of the first mask or the second mask, the monitoring device adapted to monitor a thickness of a film deposited through the openings in the masks.

2. The system of claim 1, wherein the second mask has a second opening on the peripheral edge thereof at a position that is different than the position of the first opening of the second mask.

3. The system of claim 2, wherein the second opening of the second mask corresponds to the position of the first opening of the first mask.

4. The system of claim 1, further comprising:
   a third deposition chamber; and
   a third mask of the patterned masks has a first opening formed through a peripheral edge region of the third mask outside of a pattern formed thereon, the first opening of the third mask having a position on the third mask that is different than the positions of the first openings of the first and second masks.

5. The system of claim 4, wherein the third mask has a second opening on the peripheral edge thereof at a position that is different than the position of the first opening of the third mask.

6. The system of claim 5, wherein the first opening of the third mask corresponds to the position of the first opening of the first mask.

7. The system of claim 5, wherein the third mask includes a third opening on the peripheral edge thereof adjacent to the second opening of the third mask.

8. The system of claim 7, wherein the second opening of the third mask corresponds to the position of the second opening of the second mask.

9. The system of claim 4, wherein the first opening of the third mask corresponds to the position of the first opening of the second mask.

10. The system of claim 1, wherein the first mask and the second mask each include a second opening opposing the respective first openings.

11. The system of claim 10, wherein each of the first openings and the respective second openings of each mask are aligned.

12. A deposition system, comprising:
a plurality of deposition chambers; and
a patterned mask dedicated to each of the deposition chambers, wherein:
a first mask of the patterned masks has a first opening formed through a peripheral edge region of the first mask outside of a pattern formed thereon;
a second mask of the patterned masks has a first opening formed through a peripheral edge region of the second mask outside of a pattern formed thereon, the first opening of the second mask having a position on the second mask that is different than a position of the first opening on the first mask;
a third mask of the patterned masks has a first opening formed through a peripheral edge region of the third mask outside of a pattern formed thereon, the first opening of the third mask having a position on the third mask that is different than the positions of the first openings of the first and second masks; and
a monitoring device is coupled to one of the plurality of deposition chambers, the monitoring device positioned to view the peripheral edge region of one of the first mask, the second mask, or the third mask, the monitoring device adapted to monitor properties of a film deposited through openings in the masks.

13. The system of claim 12, wherein the second mask has a second opening on the peripheral edge thereof at a position that is different than the position of the first opening of the second mask.

14. The system of claim 13, wherein the second opening of the second mask corresponds to the position of the first opening of the first mask.

15. The system of claim 12, wherein the third mask has a second opening on the peripheral edge thereof at a position that is different than the position of the first opening of the third mask.

16. The system of claim 15, wherein the first opening of the third mask corresponds to the position of the first opening of the first mask.

17. The system of claim 15, wherein the third mask includes a third opening adjacent to the second opening of the third mask.

18. The system of claim 17, wherein the second opening of the third mask corresponds to the position of the second opening of the second mask.

19. The system of claim 17, wherein the first opening of the third mask corresponds to the position of the first opening of the second mask.

* * * * *